(12) United States Patent
Hanya et al.

(10) Patent No.: US 10,217,386 B2
(45) Date of Patent: Feb. 26, 2019

(54) LIGHT-TRANSMITTING SUBSTRATE, DISPLAY DEVICE, SIGNAL DEVICE, AND ILLUMINATION DEVICE

(71) Applicant: STANLEY ELECTRIC CO., LTD., Meguro-ku, Tokyo (JP)

(72) Inventors: Akihiko Hanya, Tokyo (JP); Kosaburo Ito, Tokyo (JP); Yoshiyuki Abe, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/710,565

(22) Filed: Sep. 20, 2017

(65) Prior Publication Data

US 2018/0090035 A1    Mar. 29, 2018

(30) Foreign Application Priority Data

Sep. 23, 2016  (JP) ................................ 2016-185820

(51) Int. Cl.
*G09F 7/00* (2006.01)
*H05K 1/03* (2006.01)
(Continued)

(52) U.S. Cl.
CPC ............ *G09F 7/002* (2013.01); *E04D 13/103* (2013.01); *F21V 33/00* (2013.01); *H05K 1/0306* (2013.01); *H05K 1/167* (2013.01); *B60S 1/026* (2013.01); *H05K 2201/0108* (2013.01); *H05K 2201/0145* (2013.01); *H05K 2201/0154* (2013.01);
(Continued)

(58) Field of Classification Search
CPC ....... G09F 7/002; E04D 13/103; F21V 33/00; H05K 1/0306; H05K 1/167; H05K 2201/0145; H05K 2201/0154; H05K 2201/0162; H05K 2201/10106
See application file for complete search history.

(56) References Cited

U.S. PATENT DOCUMENTS 3,721,594 A * 3/1973 Tarnopol ........... B32B 17/10055
156/102
3,772,075 A * 11/1973 Tarnopol ............. C03C 17/3642
106/1.11
(Continued)

FOREIGN PATENT DOCUMENTS

EP    1809074 A1 * 7/2007 ........... B60Q 1/0005
JP    05170053 A * 7/1993
(Continued)

OTHER PUBLICATIONS

Extended European Search Report (EESR) dated Feb. 27, 2018 issued in counterpart European Application No. 17191666.1.

*Primary Examiner* — Daniel I Walsh
(74) *Attorney, Agent, or Firm* — Holtz, Holtz & Volek PC

(57) ABSTRACT

A thin light-transmitting substrate showing high thermal conduction efficiency, and having a function of raising surface temperature thereof is provided.
The light-transmitting substrate of the present invention comprises a substrate that transmits at least a light of a predetermined wavelength, and a conductor pattern that is disposed on the substrate, and generates heat to raise temperature of the surface of the substrate when it is supplied with an electric current. The conductor pattern is directly disposed on the substrate without any adhesive layer.

16 Claims, 11 Drawing Sheets

(51) Int. Cl.
  *H05K 1/16* (2006.01)
  *E04D 13/10* (2006.01)
  *F21V 33/00* (2006.01)
  *B60S 1/02* (2006.01)

(52) U.S. Cl.
  CPC .............. *H05K 2201/0162* (2013.01); *H05K 2201/10106* (2013.01)

(56) References Cited

U.S. PATENT DOCUMENTS

| | | | | |
|---|---|---|---|---|
| 4,065,848 A * | 1/1978 | Dery | H05B 3/84 | 219/203 |
| 4,196,338 A * | 4/1980 | Edel | G05D 22/02 | 200/61.05 |
| 4,294,867 A * | 10/1981 | Boaz | C03C 17/00 | 427/108 |
| 4,786,783 A * | 11/1988 | Woodard | B32B 17/10 | 219/203 |
| 4,971,848 A * | 11/1990 | Ruelle | H05B 3/84 | 428/38 |
| 5,070,230 A * | 12/1991 | Osada | B32B 17/10036 | 219/203 |
| 5,132,683 A * | 7/1992 | Gould | F21V 29/00 | 340/925 |
| 5,782,555 A * | 7/1998 | Hochstein | B60Q 1/2696 | 362/373 |
| 6,024,904 A * | 2/2000 | Nanri | B29C 45/14778 | 264/104 |
| 6,601,983 B1 * | 8/2003 | Runfola | B60S 1/026 | 362/545 |
| 6,648,495 B1 * | 11/2003 | Hsu | F21V 29/004 | 362/294 |
| 7,211,771 B1 * | 5/2007 | Smith | E01F 9/40 | 116/202 |
| 7,220,471 B1 * | 5/2007 | Oami | B29C 45/14811 | 428/38 |
| 8,173,939 B1 * | 5/2012 | Bobgan | H01C 3/12 | 219/202 |
| 8,242,431 B2 * | 8/2012 | Dubuc | B60Q 1/0005 | 219/494 |
| 8,371,717 B2 * | 2/2013 | Lai | F21V 23/0457 | 313/46 |
| 8,410,402 B2 * | 4/2013 | Burton | F21V 29/90 | 219/220 |
| 8,431,868 B1 * | 4/2013 | Akin | B60L 1/02 | 219/202 |
| 8,563,898 B1 * | 10/2013 | Wright | B60Q 1/0017 | 219/202 |
| 9,709,238 B2 * | 7/2017 | Dunn | F21S 48/34 | |
| 9,896,026 B2 * | 2/2018 | Snider | F21S 43/31 | |
| 2002/0092849 A1 * | 7/2002 | Petrenko | B60S 1/026 | 219/772 |
| 2002/0153368 A1 * | 10/2002 | Gardner | B29C 70/82 | 219/545 |
| 2003/0106883 A1 * | 6/2003 | Sangwan | H05B 3/84 | 219/203 |
| 2003/0112190 A1 * | 6/2003 | Baliarda | H01Q 1/1271 | 343/713 |
| 2003/0146199 A1 * | 8/2003 | Sol | B32B 17/10036 | 219/203 |
| 2003/0155467 A1 * | 8/2003 | Petrenko | A63C 1/30 | 244/134 R |
| 2004/0149734 A1 * | 8/2004 | Petrenko | B60S 1/026 | 219/538 |
| 2005/0034755 A1 * | 2/2005 | Okada | B32B 17/06 | 136/256 |
| 2006/0096967 A1 * | 5/2006 | Weiss | H05B 3/84 | 219/203 |
| 2007/0007284 A1 * | 1/2007 | Veerasamy | H05B 3/84 | 219/772 |
| 2007/0099310 A1 * | 5/2007 | Vepa | H01L 21/67288 | 438/4 |
| 2007/0114225 A1 * | 5/2007 | Smith | E01F 9/40 | 219/502 |
| 2007/0148912 A1 * | 6/2007 | Morita | H01L 21/2007 | 438/455 |
| 2007/0181565 A1 * | 8/2007 | Murahashi | B60Q 1/0005 | 219/629 |
| 2007/0187383 A1 * | 8/2007 | Wipfler | H05B 3/84 | 219/203 |
| 2007/0187391 A1 * | 8/2007 | Weiss | H05B 3/84 | 219/522 |
| 2008/0035629 A1 * | 2/2008 | Thiry | B32B 17/10 | 219/203 |
| 2008/0230536 A1 * | 9/2008 | Lee | H05B 3/342 | 219/636 |
| 2008/0274652 A1 * | 11/2008 | Li | B29C 45/14811 | 439/733.1 |
| 2009/0015197 A1 * | 1/2009 | Sogabe | H02J 7/0011 | 320/108 |
| 2009/0046456 A1 * | 2/2009 | Urano | F21K 9/00 | 362/235 |
| 2010/0149785 A1 * | 6/2010 | Dubuc | B60Q 1/0005 | 362/92 |
| 2010/0206990 A1 * | 8/2010 | Petrenko | B64D 15/163 | 244/134 D |
| 2011/0051446 A1 * | 3/2011 | Saito | F21K 9/00 | 362/509 |
| 2011/0062146 A1 * | 3/2011 | Kuriki | H05B 3/84 | 219/553 |
| 2012/0152930 A1 * | 6/2012 | Chamberlain | H05B 3/84 | 219/203 |
| 2013/0102084 A1 * | 4/2013 | Loh | B01J 21/185 | 436/94 |
| 2013/0228365 A1 * | 9/2013 | Uprety | B32B 15/08 | 174/257 |
| 2014/0138133 A1 * | 5/2014 | Byun | H05K 1/097 | 174/257 |
| 2014/0151353 A1 * | 6/2014 | Steinwandel | B64D 15/12 | 219/202 |
| 2014/0191084 A1 * | 7/2014 | Gambino | B64D 15/12 | 244/134 D |
| 2015/0338268 A1 * | 11/2015 | Ramer | G01J 1/08 | 250/208.1 |
| 2016/0091179 A1 * | 3/2016 | Jiang | F21V 19/009 | 362/218 |
| 2016/0221442 A1 * | 8/2016 | Atsumi | H01Q 1/1271 | |
| 2016/0311402 A1 * | 10/2016 | Suetsugu | B60S 1/026 | |
| 2017/0150659 A1 * | 5/2017 | Uprety | H05K 1/18 | |
| 2017/0238373 A1 * | 8/2017 | Kim | H05B 3/86 | 219/203 |
| 2018/0079379 A1 * | 3/2018 | Snider | B60J 1/1884 | |
| 2018/0090035 A1 * | 3/2018 | Hanya | G09F 7/002 | |
| 2018/0176996 A1 * | 6/2018 | Ichida | B32B 17/10036 | |

FOREIGN PATENT DOCUMENTS

| | | | | |
|---|---|---|---|---|
| JP | 07335022 A | * | 12/1995 | ............. H01L 24/29 |
| JP | 10292308 A | * | 11/1998 | |
| JP | 10312705 A | * | 11/1998 | ....... B29C 45/14811 |
| JP | 2005350975 A | * | 12/2005 | |
| JP | 2006169884 A | | 6/2006 | |
| JP | 2009299335 A | | 12/2009 | |
| JP | 2013117661 A | | 6/2013 | |

* cited by examiner

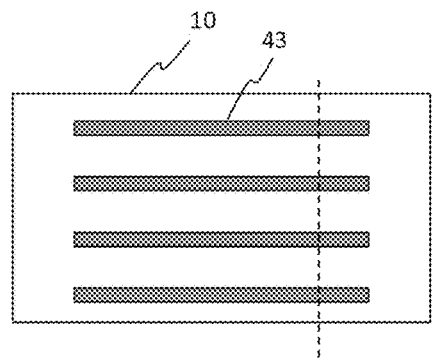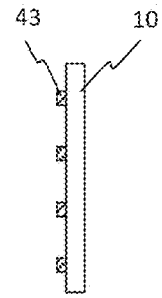
Fig. 3A		Fig. 3B
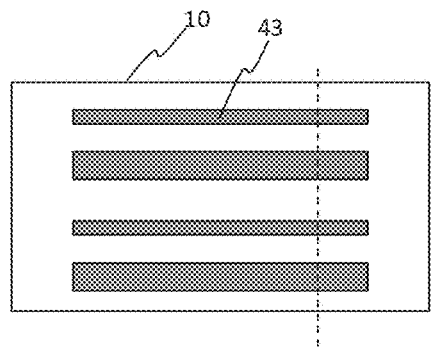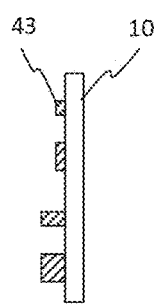
Fig. 4A		Fig. 4B
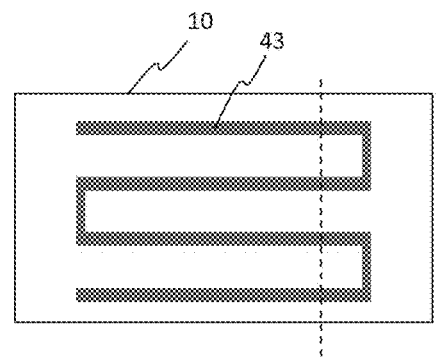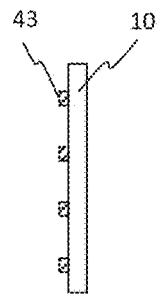
Fig. 5A		Fig. 5B

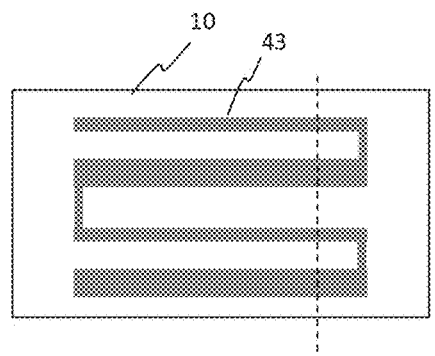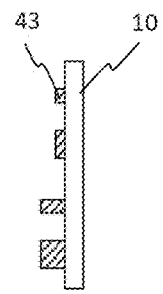
Fig. 6A        Fig. 6B
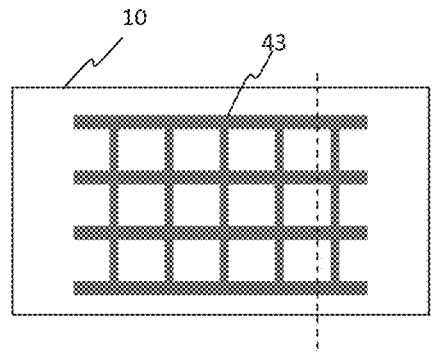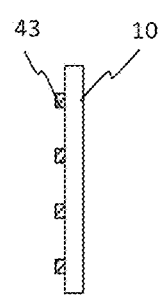
Fig. 7A        Fig. 7B
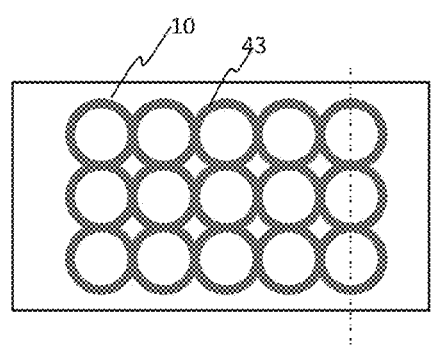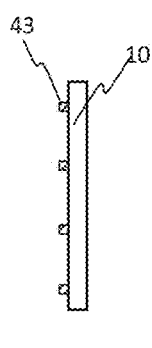
Fig. 8A        Fig. 8B

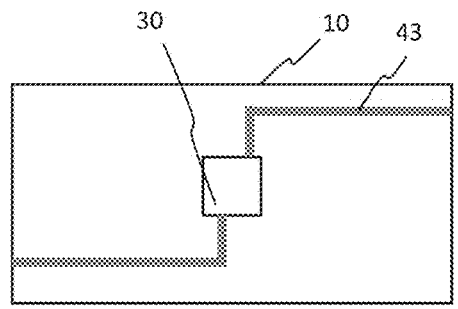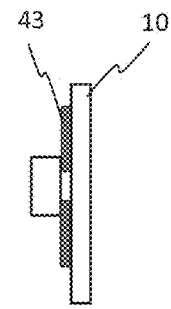
Fig. 11A　　　Fig. 11B
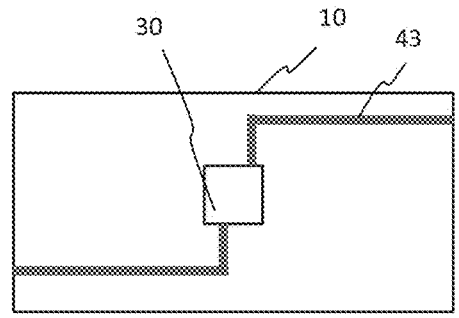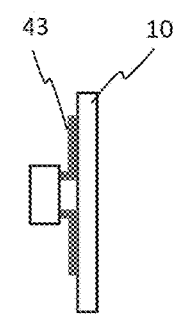
Fig. 12A　　　Fig. 12B
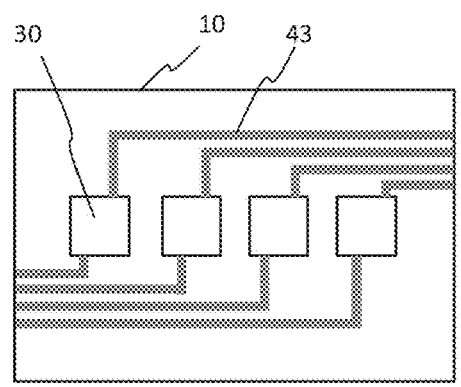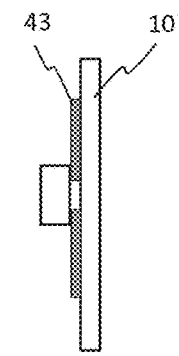
Fig. 13A　　　Fig. 13B

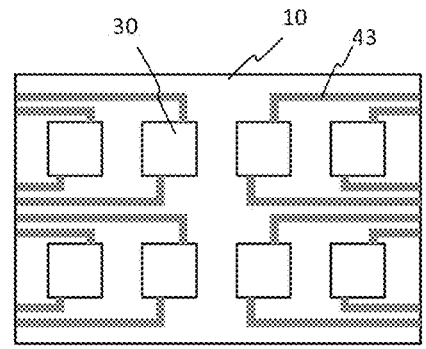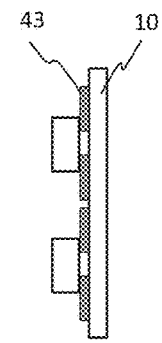
Fig. 14A                Fig. 14B
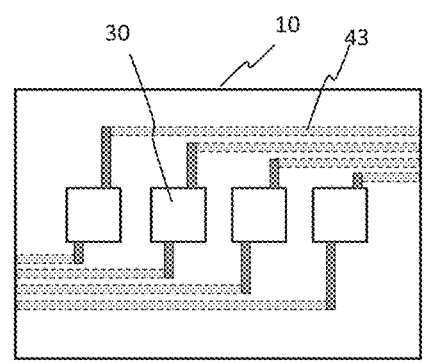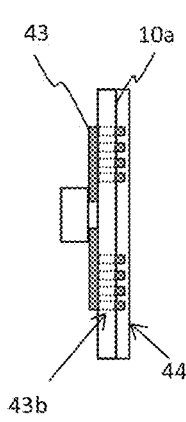
Fig. 15A                Fig. 15B
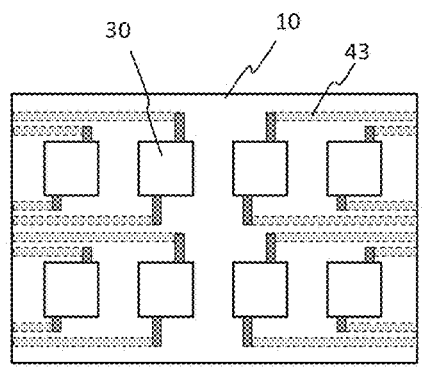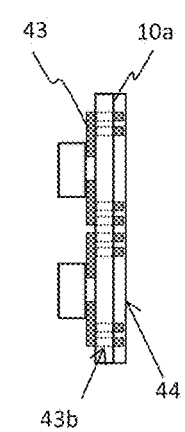
Fig. 16A                Fig. 16B Light-emitting surface side Light-emitting surface side

LIGHT-TRANSMITTING SUBSTRATE, DISPLAY DEVICE, SIGNAL DEVICE, AND ILLUMINATION DEVICE

TECHNICAL FIELD

The present invention relates to a light-transmitting substrate having a function of raising surface temperature thereof.

BACKGROUND ART

Signs having a snow-melting function for preventing degradation of visibility of the signs due to adhesion of snow are disclosed in Patent document 1, and so forth. The sign disclosed in Patent document 1 has a structure that a snow-melting unit is disposed on a surface of an LED display comprising a plurality of LEDs disposed in the form of matrix. The surface of the LED display is covered with an acrylic resin plate. The snow-melting unit has a configuration that two of acrylic resin plates other than that of the LED display are facingly disposed with a metal frame between them, and a heater in the form of cord is disposed in the internal space, and the sign has a configuration that this snow-melting unit is adhered to the acrylic resin plate on the surface of the LED display. When the heater is electrified, air in the internal space of the snow-melting unit is heated by the Joule heat generated by the heater and heat accompanying molecular motions caused by emitted far-infrared rays, and the acrylic resin plate is heated by the air. As a result, snow adhered to the acrylic resin plate can be melted.

PRIOR ART REFERENCE

Patent Document

Patent document 1: Japanese Patent Unexamined Publication (KOKAI) No. 2009-299335

SUMMARY OF THE INVENTION

Object to be Achieved by the Invention

The snow-melting unit disclosed in Patent document 1 has a configuration that an internal space is formed by facingly disposed two of acrylic resin plates, air in the internal space is heated with the heater, and the acrylic resin plate is heated with the air. However, since both air and acrylic resin plate have a low thermal conductivity (about 0.17 to 0.25 W/mK at ordinary temperature), and therefore they cannot efficiently conduct the heat generated by the heater to the surface of the acrylic resin plate. Therefore, it is difficult to obtain high thermal conduction efficiency with this unit, and electric power required for melting snow becomes large. In addition, since the internal space is formed by facingly disposed two of the acrylic resin plates with the frame between them, the sign requires members that do not directly relate to display of the sign, and thickness of the snow-melting unit becomes larger. Further, since it employs the structure that the internal space is formed, rigidity is required for the acrylic resin plates, and therefore even if it is desired to make the acrylic resin plates of the snow-melting unit thinner in order to improve the thermal conduction efficiency, and obtain a thinner unit, it is difficult to do so more than a certain extent. Furthermore, since the unit suffers from low thermal conduction efficiency, and requires much electric power for melting snow, it is necessary to use a heater having a diameter larger than a certain extent, and thus it becomes difficult to see the sign displayed on the LED display through the snow-melting unit.

An object of the present invention is to provide a thin light-transmitting substrate showing high thermal conduction efficiency, and having a function of raising temperature of the surface thereof.

Means for Achieving the Object

In order to achieve the aforementioned object, the light-transmitting substrate of the present invention comprises a substrate that transmits at least a light of a predetermined wavelength, and a conductor pattern that is disposed on the substrate, and generates heat to raise temperature of the surface of the substrate when an electric current is supplied. The conductor pattern is directly disposed on the substrate without any adhesive layer.

Effect of the Invention

According to the present invention, there can be obtained a light-transmitting substrate that can be made thin in spite of having the function of raising the surface temperature, and shows high thermal conduction efficiency.

BRIEF DESCRIPTION OF THE DRAWINGS

FIGS. 3A and 3B are a top view and a sectional view of an example of the light-transmitting substrate of the first embodiment, respectively.

FIGS. 4A and 4B are a top view and a sectional view of an example of the light-transmitting substrate of the first embodiment, respectively.

FIGS. 5A and 5B are a top view and a sectional view of an example of the light-transmitting substrate of the first embodiment, respectively.

FIGS. 6A and 6B are a top view and a sectional view of an example of the light-transmitting substrate of the first embodiment, respectively.

FIGS. 7A and 7B are a top view and a sectional view of an example of the light-transmitting substrate of the first embodiment, respectively.

FIGS. 8A and 8B are a top view and a sectional view of an example of the light-transmitting substrate of the first embodiment, respectively.

FIGS. 11A and 11B are a top view and a sectional view of an example of the light-transmitting substrate of the second embodiment.

FIGS. 12A and 12B are a top view and a sectional view of an example of the light-transmitting substrate of the second embodiment.

FIGS. 13A and 13B are a top view and a sectional view of an example of the light-transmitting substrate of the second embodiment.

FIGS. 14A and 14B are a top view and a sectional view of an example of the light-transmitting substrate of the second embodiment.

FIGS. 15A and 15B are a top view and a sectional view of an example of the light-transmitting substrate of the second embodiment.

FIGS. 16A and 16B are a top view and a sectional view of an example of the light-transmitting substrate of the second embodiment.

MODES FOR CARRYING OUT THE INVENTION

Hereafter, embodiments of the present invention will be explained with reference to the drawings.

First Embodiment

The light-transmitting substrate of the first embodiment will be explained. This light-transmitting substrate is disposed on such an article as a device that emits light from the inside to the outside of the device, transparent article in which light transmits at least the outermost surface layer thereof, and mirror, so that the substrate constitutes the outermost surface, and has a function of evaporating or melting moisture or snow adhering to the surface.

Figure 1:
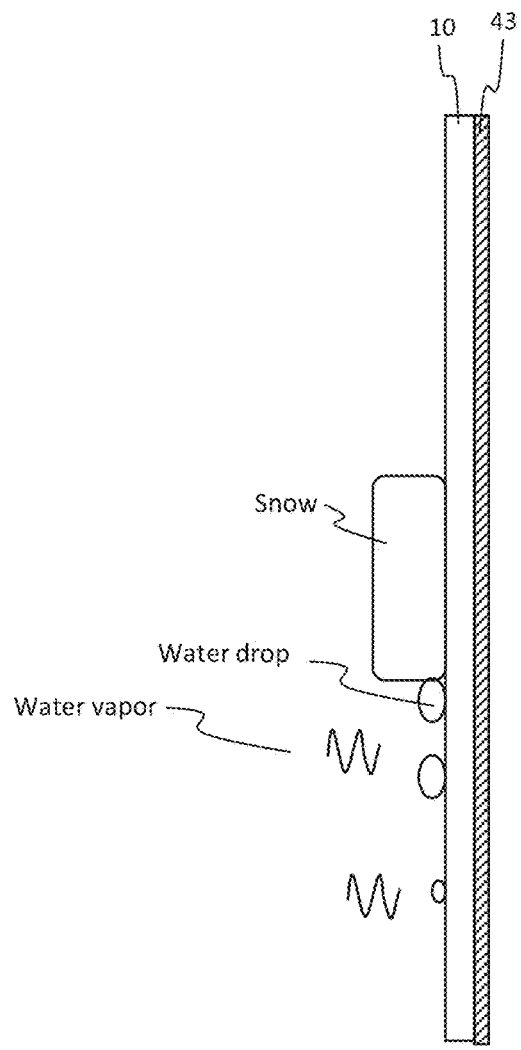
FIG. 1 is a sectional view of a light-transmitting substrate of the first embodiment.

A sectional view of a light-transmitting substrate of this embodiment is shown as FIG. 1. As shown in FIG. 1, the light-transmitting substrate of this embodiment comprises and is constituted by a substrate 10 that transmits at least a light of a predetermined wavelength, and a conductor pattern 43 that is disposed on the substrate 10. The conductor pattern 43 generates heat to raise temperature of the surface of the substrate 10 when it is supplied with an electric current. According to this embodiment, the conductor pattern is directly disposed on the substrate 10 without any adhesive layer.

An adhesive layer used for adhering a conductor pattern to a substrate, such as an adhesive layer made from epoxy resin or acrylic resin, generally contains air, and therefore shows low thermal conductivity. However, according to this embodiment, the conductor pattern 43 is directly disposed on the substrate 10 without any adhesive layer, and therefore heat generated by the conductor pattern 43 can be highly efficiently conducted to the substrate 10. Therefore, snow or moisture adhering to the substrate 10 can be melted or evaporated with reduced electric power to be supplied to the conductor pattern.

Such a conductor pattern 43 can be formed by, for example, sintering conductive particles. Specifically, it can be formed by sintering conductive particles placed on the substrate 10 with light. The conductor constituting the conductor pattern 43 can be thereby adhered to the substrate 10 at the interface of the conductor pattern 43 and the substrate 10. The sintering method is not limited to sintering with light, and any other sintering method may be used so long as a method that can sinter conductive particles and adhere them to the substrate 10 is chosen. For example, a method of irradiating electromagnetic waves, and a method of locally flowing an electric current can be used.

Figure 2:
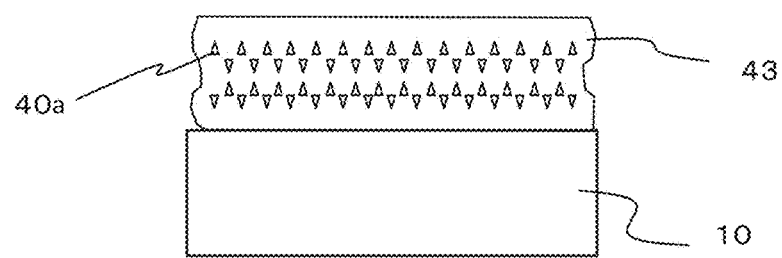
FIG. 2 is an explanatory drawing showing that the conductor pattern of the light-transmitting substrate of the first embodiment is porous.

The conductor pattern 43 is desirably a porous member containing voids 40a in the inside thereof, as shown in FIG. 2. The conductor pattern 43 formed so as to be porous has flexibility. Therefore, even when a flexible substrate 10 is used, it can deform with following deflection of the substrate, and thus a flexible light-transmitting substrate can be provided.

The substrate 10 may be made of any material, and for example, one made of a resin can be used.

The substrate 10 may also have a configuration that it contains a base material that transmits light of a predetermined wavelength, and a filler dispersed in the base material. In such a case, by using a material showing a thermal conductivity higher than that of the base material as the filler, thermal conductivity of the substrate can be improved. For example, a silicone resin can be used as the base material, and silica having a particle diameter of several nanometers to several tens of micrometers can be used as the filler.

As the shape of the conductor pattern 43, any desired shape such as line, grid, and circle can be used, as top views and sectional views of examples thereof are shown in FIGS. 3A and 3B to FIGS. 8A and 8B, respectively. Pattern shape of the conductor pattern 43 is designed so that the conductor pattern 43 is densely disposed in a region in which temperature of the substrate 10 is desired to be raised. The conductor pattern 43 may be a pattern that has a region having at least one of width and height larger or smaller than those of another region, as shown in FIGS. 4A and 4B, or FIGS. 6A and 6B. In such a case, sectional area of the conductor pattern having at least one of width and height smaller than those of the other region becomes smaller than that of the other region, and therefore electric resistance and calorific value thereof become larger. Accordingly, it is desirable to use a smaller width or height of the conductor pattern 43 for a region of the substrate 10 of which temperature is desired to be made higher than that of the other region, for example, a display region in the case of being used in a display device, or a region in which a signal is displayed in the case of a signal device.

The conductor pattern 43 may also have a configuration that it has a region constituted with a conductor material different from that of another region. For example, if the conductor pattern 43 of a region of which temperature is desired to be made higher than that of the other region is formed with a conductor material having a larger electric resistance in the substrate 10, calorific value thereof can be made higher.

It is desirable that, for at least a part of the conductor pattern 43, the surface thereof not contacting with the substrate 10 is a curved surface. For example, a conductor pattern 43 having a section of semicircle shape, or a conductor pattern 43 having an R-shaped end can be used. By using a conductor pattern having such a curved surface, the area that does not contact with the substrate 10 can be reduced compared with, for example, the case of using a conductor pattern having a rectangular section, therefore heat radiation from the surface not contacting with the substrate 10 can be reduced, and a larger amount of heat can be conducted to the substrate 10. If adhesion of moisture is not good for the base material of the substrate, the surface to which snow or moisture adheres may be protected by providing a coating film or the like thereon.

The method for producing the light-transmitting substrate of the first embodiment will be explained with reference to FIGS. 9A and 9B.

Figures 9A, 9B:
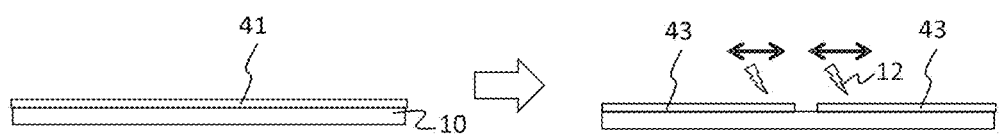
FIGS. 9A and 9B are explanatory drawings showing a method for producing the light-transmitting substrate of the first embodiment.

First, as shown in FIG. 9A, a dispersion in which conductive particles and an insulating material are dispersed, or a dispersion in which conductive particles coated with an insulating material layer are dispersed is applied to a surface of the substrate 10 in a desired shape. A film 41 of the conductive particle coated with the insulating material is thereby formed on the surface of the substrate 10. The solvent is evaporated to dry the film 41 with heating the film as required. In the film 41, conductive particles, of which typical examples include conductive nanoparticles, are dispersed, and the conductive particles are in a state that the surfaces thereof are covered with the insulating material.

Then, as shown in FIG. 9B, the film 41 is irradiated with a light flux 12 of a predetermined shape. It is desirable that, in this process, the light flux 12 is irradiated on only a partial region of the film 41 to attain the sintering. In the region of the film 41 irradiated with the light flux 12, the conductive particles absorb energy of the light, and the temperature thereof rises. As a result, the conductive particles melt at a temperature lower than the melting point of the bulk of the material constituting the particles, a large part of the surrounding insulating material layer is evaporated with the rise of the temperature of the conductive particles, and even if a part of the material remains, it is softened. Therefore, the melted conductive particles directly fuse with adjacent particles, or penetrate the softened insulating material layer and fuse with adjacent particles. The conductive particles are thereby sintered, and a conductive conductor pattern 43 is formed on the upper surface of the substrate 10. The melted conductive particles adhere to the substrate 10 during this process.

As described above, temperature of the conductive particles in the region of the film 41 irradiated with the light flux 12 rises due to the irradiation of light. This heat is used for sintering of the conductive particles, and at the same time, it conducts to the surrounding portions of the film 41 and the substrate 10, and radiated. Therefore, temperature of only the region of the film 41 irradiated with the light flux 12, or only the region irradiated with the light flux 12 and adjacent regions thereof reaches the temperature at which the conductive particles are sintered, and temperature of the film 41 of a part outside the aforementioned region and temperature of the substrate 10 do not reach the temperature at which the materials constituting them are melted or denatured.

That is, according to this embodiment, only a part of the film 41 is irradiated with the light flux 12, therefore heat can be conducted to the substrate 10 and the surrounding part of the film 41, and radiated, and temperature rise of the substrate 10 can be suppressed. Accordingly, even if the substrate 10 consists of a material that is easily deformed by heat such as a thin and flexible resin material, deformation, distortion, and denaturation such as opacification of the substrate possibly caused by the light sintering can be prevented. In addition, when the substrate 10 is flexible, the flexibility can be maintained.

In the step of FIG. 9B, it is desirable to form the conductor pattern 43 so as to be porous as shown in FIG. 2. That is, it is desirable that the light sintering is performed at such a temperature that the whole conductive particles are not completely melted and mixed, but adjacent conductive particles are fused only at contacting surfaces thereof so that voids 40a are formed between at least a part of the sintered conductive particles. For example, if a laser light is used as the light flux 12, and irradiated on the film 41 at such an irradiation intensity that the substrate 10 through which the light transmits is not melted, comparatively large energy can be given to the region of the film 41 irradiated with the light flux 12 in a short period of time, thus the conductive particles can be melted by heating and sintered, and by terminating the irradiation of the light flux 12 of the laser light, cooling can be quickly attained by heat conduction to a surrounding part of the film 41 and the substrate 10. Therefore, a porous circuit pattern can be formed.

In other words, when the sintering is performed in the film 41 with the light flux 12 of laser light, a porous conductor pattern 43 can be formed by adjusting irradiation intensity of the light flux 12 so that the film 41 should have an appropriate temperature. Specifically, by using a stretched polyethylene terephthalate (PET) film (melting point, about 250° C.; heatproof temperature, about 150° C.) as the substrate 10, and irradiating the substrate 10 with the light flux 12 of laser light from the back surface of the substrate 10 with adjusting the intensity of the light flux so that shape of the substrate is maintained to sinter the conductive particles in the film 41, the porous conductor pattern 43 can be formed.

If the conductor pattern 43 is porous, the conductor pattern 43 itself has shape-following property (flexibility) as described above. Therefore, even if the flexible substrate 10 is deformed, the conductor pattern 43 also deforms to follow the substrate, thus the conductor pattern 43 does not easily peel from the substrate 10, and cracks and so forth are not easily produced, either. As a result, there can be provided a flexible light-transmitting substrate that does not easily produce disconnection.

As for shape of the light flux 12 irradiated on the film 41 in the step shown in FIG. 9B, the light flux 12 may be shaped into the shape of the conductor pattern 43 by passing it through a mask, and then irradiated, or the shape of the conductor pattern 43 may be scanned with the light flux 12 having a round or rectangular irradiation spot shape so that the light flux 12 is irradiated in the shape of the conductor pattern 43.

By the steps explained above, the conductor pattern 43 can be formed on the substrate 10 through such easy steps as application and light irradiation.

In the step shown in FIG. 9B, there is used the light flux 12 of such a wavelength that the light flux can be absorbed by the conductive particles contained in the film 41. The light to be irradiated may be any of ultraviolet, visible, and infrared lights. For example, when particles of Ag, Cu, Au, Pd, or the like are used as the conductive particles, a visible light of 400 to 600 nm can be used.

When there is a region of the film 41 that is not irradiated with the light, sintering does not occur in this region, and therefore the particles remain in a state of being not sintered. Such a portion of the film 41 in which the particles are not sintered may be removed in the following step. For example, such a portion of the film 41 can be removed by using an organic solvent or the like. For such a portion of the film 41, sintering can also be additionally performed by heating or the like.

The substrate 10 may consist of any material, so long as at least the surface thereof is insulating, it has such a translucency that irradiation of the light flux 12 through it is possible, and it can bear the temperature that the substrate 10 reaches at the time of irradiation of the light flux 12 on the film 41. There can be used, for example, organic materials such as polyethylene terephthalate (PET), polyethylene naphthalate (PEN), polycarbonate (PC), polystyrene (PS), polyimide, epoxy, silicone, glass/epoxy resin substrate, and paper/phenol resin substrate, and inorganic materials such as ceramics and glass. The substrate 10 may also consist of a flexible printed circuit board or a metal substrate of which surface is coated with an insulating layer, so long as at least a part of irradiated light can transmit through it. The substrate 10 in the form of a film can also be used.

As material of the conductive particles contained in the film 41, one or more kinds of conductive metals and conductive metal oxides of Au, Ag, Cu, Pd, Ni, ITO, Pt, Fe, and so forth can be used. As for particle size of the conductive particles, the conductive particles may consist only of nanoparticles having a particle size smaller than 1 µm, or a mixture of nanoparticles having a particle size smaller than 1 µm and microparticles having a particle size not smaller than 1 µm.

As the insulating material at least contained in the film 41, or the insulating material that coats the conductive particles contained in the film 41, there can be used one or more kinds of materials selected from organic materials such as styrene resin, epoxy resin, silicone resin, and acrylic resin, inorganic materials such as $SiO_2$, $Al_2O_3$, and $TiO_2$, and organic and inorganic hybrid materials. Thickness of the insulating material layer that coats the conductive particles in the film 41 is preferably about 1 nm to 10 µm. If the insulating material layer is unduly thin, the particles aggregate at the time of the application of ink, and therefore sintering temperature rises. If the insulating material layer is unduly thick, the electric conductivity of the conductor pattern 43 obtained after sintering by light irradiation is degraded, and thus resistance becomes higher.

The conductive particles and the insulating material, or the conductive particles coated with the insulating material layers are made into a dispersion to be applied in the step shown in FIG. 9A by dispersing them in a solvent. As the solvent, an organic solvent or water can be used.

As for size of the conductor pattern 43, it can be formed to have, for example, a width of 1 µm or larger, and a thickness of about 1 nm to 10 µm. Electric resistivity of the conductor pattern 43 is desirably $10^{-4}$ Ω·cm or lower, particularly desirably such a low resistance as $10^{-6}$ Ω·cm order.

As the method for forming the film 41 in the step shown in FIG. 9A, any method may be used, so long as it is a method by which the film 41 of a desired thickness can be formed. When the film 41 is formed by printing, gravure printing, flexographic printing, ink jet printing, screen printing, and so forth can be used.

In the explanation of this embodiment described above, the film 41 on the substrate 10 is irradiated with the light flux 12 from above. However, if a substrate that can transmit the light flux 12 is used as the substrate 10, the light flux 12 may be transmitted through the substrate 10 and irradiated on the film 41.

In the above explanation of the first embodiment, the sintering of the particles in the film 41 is performed by irradiating the light flux. However, the same functions and effects can be obtained even by using a method other than light flux irradiation, if the method is a method that can supply energy to only a part of the film 41 to heat it. For example, a method of irradiating converged microwaves, or a method of contacting a needlelike probe with the film or bringing the same close to the film, and locally supplying electric current or electric power can be used.

According to this embodiment, there can be obtained a light-transmitting substrate that is thin and shows high thermal conduction efficiency, because it comprises only one substrate, and has a function of raising surface temperature thereof.

Second Embodiment

The light-transmitting substrate of the second embodiment will be explained.

Figure 10:
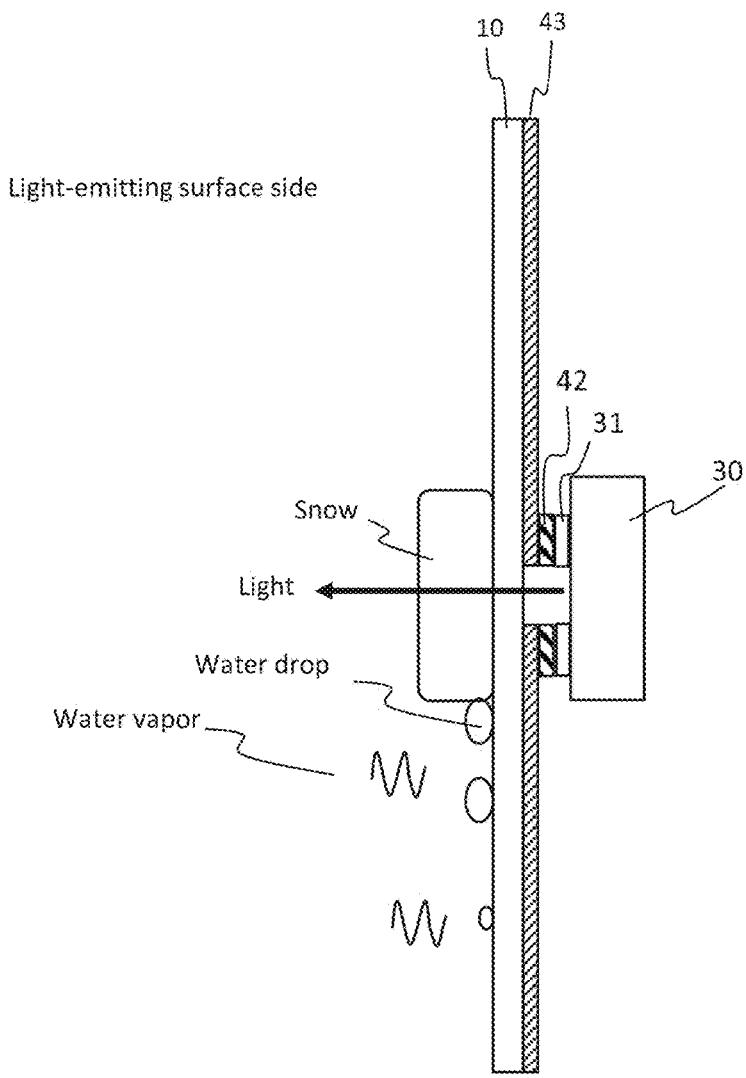
FIG. 10 is a sectional view of a light-transmitting substrate of the second embodiment.

In the light-transmitting substrate of the second embodiment, a light-emitting element 30 is mounted on the surface of the substrate 10 on which the conductor pattern 43 of the first embodiment is disposed, as shown in FIG. 10. The light-emitting element 30 is connected to the conductor pattern 43, supplied with an electric current via the conductor pattern, and emits light. The conductor pattern 43 itself generates heat, and also conducts heat generated by the light-emitting element 30 to raise temperature of a portion of the substrate 10 remote from the light-emitting element 30.

As shown in FIG. 10, the light-emitting element 30 can be disposed on the substrate 10 with a light-emitting surface thereof on the substrate 10 side to realize a structure that light emitted from the light-emitting surface is transmitted through the substrate 10 and projected to the outside. As a result, there can be provided a transparent substrate that has not only a light-emitting function, but also a function of raising temperature of the substrate 10, so that the emitted light is hardly shielded by snow or moisture.

In the second embodiment, the shape of the conductor pattern 43 and the disposition of the light-emitting element 30 may be desired shape and disposition, as examples of top view and side view thereof are shown in FIGS. 11A and 11B to FIGS. 16A and 16B, respectively. As in the first embodiment, pattern shape of the conductor pattern 43 is designed so that the conductor pattern 43 is densely disposed in a region in which temperature of the substrate 10 is desired to be raised.

Further, as shown in FIGS. 15A and 15B, or FIGS. 16A and 16B, the conductor pattern 43 may be led to the opposite surface 10a of the substrate 10 via a through-hole 43b, and the conductor pattern 43 may be disposed also on the opposite surface 10a of the substrate 10. In this case, since the opposite surface 10a of the substrate 10 serves as the light-projecting surface, and faces the outside, it is desirable that the conductor pattern 43 is protected with a coating part 44.

The shapes and configurations of the conductor pattern 43 other than those explained above are the same as those of the first embodiment, and therefore explanations thereof are omitted.

The method for producing the light-transmitting substrate of the second embodiment will be explained with reference to FIGS. 17A to 17E.

Figure 17A:
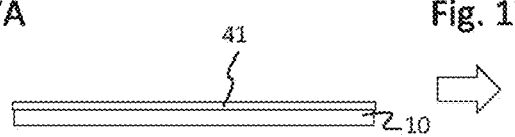
FIGS. 17A to 17E are explanatory drawings showing a method for producing the light-transmitting substrate of the second embodiment.
Figure 17B:
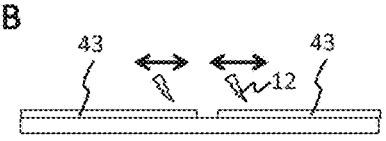

First, in the steps shown in FIGS. 17A and 17B, the conductive conductor pattern 43 is formed on the upper surface of the substrate 10 in the same manners as that of the steps for the first embodiment shown in FIGS. 9A and 9B.

Figure 17C:
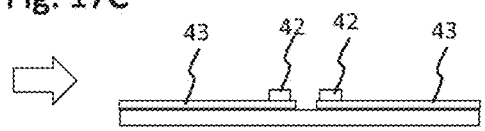

As shown in FIG. 17C, bumps 42, solder balls, and so forth are provided on the conductor pattern 43 as required.

Figure 17D:
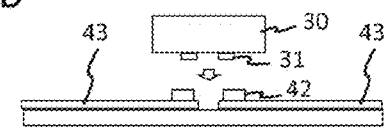
Figure 17E:
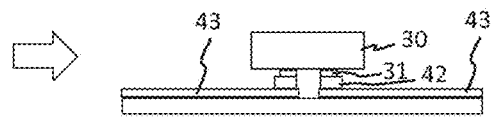

As shown in FIG. 17D, the light-emitting element 30 is aligned so that the electrodes 31 thereof correspond to the conductor pattern 43, and mounted. When the bumps 42 or the like are disposed, the light-emitting element 30 is aligned so that the positions of the bumps 42 correspond to the positions of the electrodes 31 of the light-emitting element 30. Then, they are heated or applied with a supersonic wave to connect the electrodes 31 of the light-emitting element 30 with the conductor pattern 43 and thereby fix the light-emitting element 30 (FIG. 17E). If needed, a transparent adhesive layer may be filled between the bottom surface of the light-emitting element 30 and the upper surface of the substrate 10.

When the conductor pattern 43 is formed also on the back surface of the substrate 10 via the through-hole 43b, the steps of FIGS. 17A and 17B are performed also for the back surface 10a of the substrate 10. If adhesion of moisture is not good for the base material of the substrate, there may be added a step of protecting the surface to which snow or moisture adheres by providing a coating film or the like thereon.

By the steps explained above, the conductor pattern 43 can be formed on the upper and lower surfaces of the substrate 10 through such easy steps as application and light irradiation, and a light-transmitting substrate mounting a light-emitting element 30 can be produced.

As the light-emitting element 30, any kind of light-emitting element may be used, and for example, LED, LD, and display devices (liquid crystal display device, plasma display device, EL display device, etc.) can be used. As LED, InGaN type LED that emits, for example, blue light (wavelength 460 nm), InGaN type LED that emits, for example, green light (wavelength 520 nm), and AlGaInP type LED that emits, for example, red light (wavelength 620 nm) can be used. The light-emitting element is not limited to those of these wavelengths, and any light-emitting element that emits ultraviolet light, visible light, infrared light, or the like may be used. It is also possible to mount a light-receiving element instead of the light-emitting element 30 to constitute a light-receiving device.

In the explanation of this embodiment described above, the film 41 on the substrate 10 is irradiated with the light flux 12 from above. However, the light flux 12 may be transmitted through the substrate 10 and irradiated on the film 41. According to this method, the formation of the conductor pattern 43 and connection between the light-emitting element 30 and the conductor pattern 43 can be simultaneously or successively performed by irradiation of the light flux 12, and it is not necessary to use bumps or the like. The electrode 31 and the conductor pattern 43 may also be connected by sintering conductive particles between them using a dispersion in which the conductive particles and an insulating material are dispersed, or a dispersion in which the conductive particles coated with an insulating material layer are dispersed, as in the case of the film 41.

Third Embodiment

The light-transmitting substrates of the first and second embodiments can be disposed on a display device, signal device, or illumination device so that the substrate constitutes the outermost surface. Snow and moisture adhering to these devices can be thereby, for example, evaporated. In these devices, the light-transmitting substrate is preferably disposed so that the surface opposite to the surface on which the conductor pattern 43 is disposed faces the outside.

Fourth Embodiment

Figure 18:
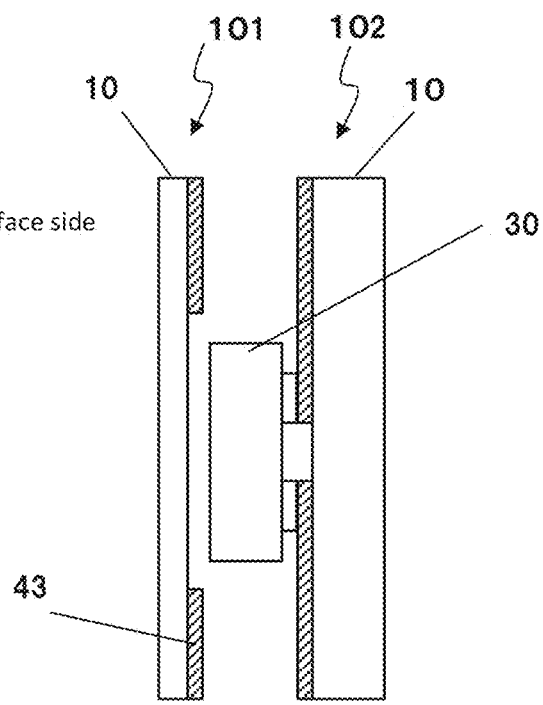
FIG. 18 is a sectional view of an example of the light-transmitting substrate of the fourth embodiment.

Further, by facingly disposing the light-transmitting substrate 101 of the first embodiment, and the light-transmitting substrate 102 of the second embodiment carrying the light-emitting element 30 so that the surfaces on which the conductor patterns 43 are formed face each other as shown in FIG. 18, a display device can be constituted. This device is constituted so that the light emitted by the light-emitting element 30 is projected toward the light-transmitting substrate 101, transmitted through the light-transmitting substrate 101 on the external side, and projected to the outside. It is desirable that the device is designed so that, as shown in FIG. 18, the conductor pattern 43 should not be disposed in a region facing the light-emitting element 30 of the light-transmitting substrate 101, or a light-transmittable region is provided for such a region.

Figure 19:
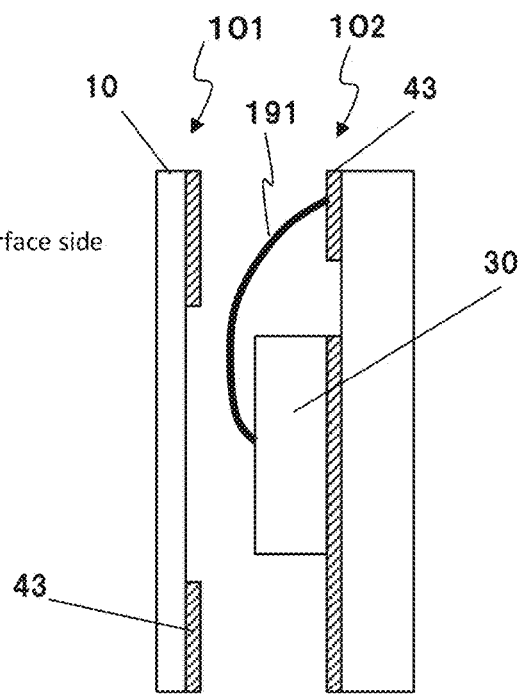
FIG. 19 is a sectional view of the light-transmitting substrate of the second or fourth embodiment, in which a light-emitting element is connected with a bonding wire.
Figure 20:
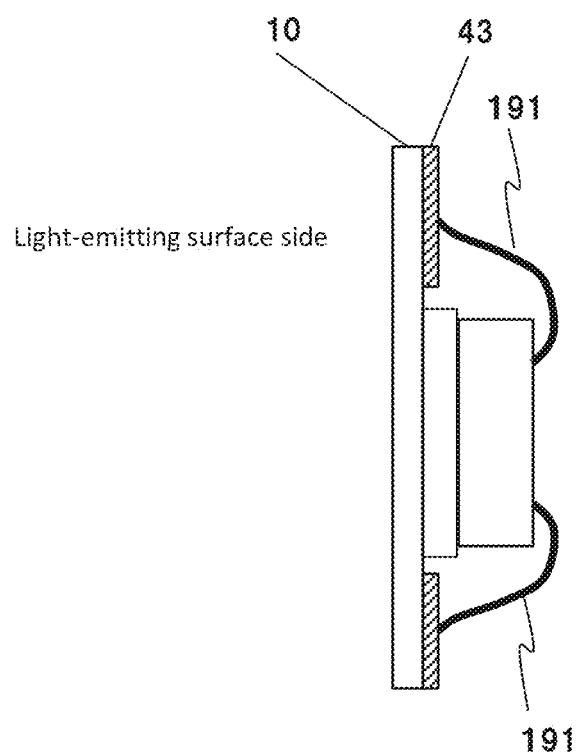
FIG. 20 is a sectional view of the light-transmitting substrate of the second or fourth embodiment, in which a light-emitting element is connected with a bonding wire.

In the above explanations of the second and fourth embodiments, examples in which the light-emitting element 30 is flip-chip mounted are explained. However, as shown in FIGS. 19 and 20, at least one electrode may be disposed on the upper surface, and connected with the conductor pattern 43 with a bonding wire 191. When two electrodes are connected with bonding wires as shown in FIG. 20, it is desirable to fix the light-emitting element 30 to the substrate 10 with a transparent adhesive material.

When a space is formed between the two substrates 10 as shown in FIGS. 18 and 19, it is preferably sealed by using a sealing resin, or the like.

DESCRIPTION OF NOTATIONS

10 . . . Substrate, 30 . . . light-emitting element, 41 . . . film, 42 . . . bump, 43 . . . conductor pattern

What is claimed is:

1. A display device comprising:
a light-transmitting substrate comprising a substrate that transmits at least a light of a predetermined wavelength, the substrate constituting an outermost surface of the display device;
a conductor pattern that is disposed on the substrate and that generates heat to raise a temperature of the substrate when the conductor pattern is supplied with an electric current; and
a light-emitting element that is disposed on a surface of the substrate on which the conductor pattern is disposed, the light-emitting element being connected to the conductor pattern and emitting light when the light-emitting element is supplied with an electric current via the conductor pattern,
wherein:
the conductor pattern is directly disposed on the substrate without any adhesive layer;
the conductor pattern conducts heat generated by the light-emitting element to raise the temperature of the substrate at a position remote from the light-emitting element; and
the light-emitting element has a light-emitting surface, the light-emitting element being disposed such that the light-emitting surface is on a side of the light-emitting element facing the substrate and such that light emitted from the light-emitting surface is transmitted through the substrate and is projected to outside of the substrate.

2. The display device according to claim 1, wherein a conductor that constitutes the conductor pattern is porous.

3. The display device according to claim 2, wherein the conductor that constitutes the conductor pattern adheres to the substrate at an interface of the conductor pattern and the substrate.

4. The display device according to claim 1, wherein a conductor that constitutes the conductor pattern is obtained by sintering conductive particles.

5. The display device according to claim 1, wherein the substrate consists of a resin.

6. The display device according to claim 1, wherein the substrate and the conductor pattern are flexible.

7. The display device according to claim 6, wherein a conductor that constitutes the conductor pattern is porous.

8. The display device according to claim 1, wherein the conductor pattern has a region having at least one of a width and a height smaller or larger than those of other regions.

9. The display device according to claim 8, wherein a conductor that constitutes the conductor pattern is porous.

10. The display device according to claim 1, wherein the conductor pattern has a region constituted with a conductor material different from those of other regions.

11. The display device according to claim 1, wherein the substrate comprises a base material that transmits the light of the predetermined wavelength, and a filler dispersed in the base material, and wherein the filler has a thermal conductivity higher than that of the base material.

12. The display device according to claim 1, wherein at least a part of the conductor pattern has a curved surface not contacting with the substrate.

13. The display device according to claim 1, wherein the light-transmitting substrate is disposed such that the surface of the substrate opposite to the surface of the substrate on which the conductor pattern is disposed faces the outside of the substrate.

14. The display device according to claim 1, the display device being a signal device.

15. The display device according to claim 1, the display device being an illumination device.

16. The display device according to claim 15, wherein a conductor that constitutes the conductor pattern is porous.

* * * * *